(12) United States Patent
He

(10) Patent No.: US 11,171,182 B2
(45) Date of Patent: Nov. 9, 2021

(54) LIGHT-EMITTING SUBSTRATE AND DISPLAY DEVICE

(71) Applicant: Wuhan China Star Optoelectronics Semiconductor Display Technology Co., Ltd., Wuhan (CN)

(72) Inventor: Ruiting He, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/754,148

(22) PCT Filed: Sep. 11, 2019

(86) PCT No.: PCT/CN2019/105294
§ 371 (c)(1),
(2) Date: Apr. 7, 2020

(87) PCT Pub. No.: WO2021/007942
PCT Pub. Date: Jan. 21, 2021

(65) Prior Publication Data
US 2021/0020705 A1    Jan. 21, 2021

(30) Foreign Application Priority Data

Jul. 15, 2019    (CN) .......................... 201910636037.6

(51) Int. Cl.
*H01L 27/32*    (2006.01)
*H01L 51/00*    (2006.01)

(52) U.S. Cl.
CPC ...... *H01L 27/3218* (2013.01); *H01L 51/0011* (2013.01)

(58) Field of Classification Search
None
See application file for complete search history.

(56) References Cited

U.S. PATENT DOCUMENTS

2009/0102753 A1\* 4/2009 Yamashita ........... G09G 3/3233
345/55
2009/0121983 A1    5/2009 Sung et al.
(Continued)

FOREIGN PATENT DOCUMENTS

CN    107086239    8/2017
CN    107342039    11/2017
(Continued)

*Primary Examiner* — Hsien Ming Lee

(57) ABSTRACT

A light-emitting substrate and a display device are provided. The light-emitting substrate including a substrate, and a first pixel group and a second pixel group arranged on the substrate and spaced apart from each other, wherein a third pixel group is disposed between the first pixel group and the second pixel group, a first interval is defined between the first pixel group and the third pixel group, and between the second pixel group and the third pixel group, a second interval is defined between adjacent first sub-pixels of the first pixel group, a third interval is defined between adjacent second sub-pixels of the second pixel group, a fourth interval is defined between adjacent third sub-pixels of the third pixel group, and the first sub-pixels, the second sub-pixels, and the third sub-pixels are all different in colors.

14 Claims, 3 Drawing Sheets

(56) References Cited

U.S. PATENT DOCUMENTS

| | | | |
|---|---|---|---|
| 2014/0111115 A1* | 4/2014 | Bai | H01L 27/3218 315/312 |
| 2017/0004757 A1* | 1/2017 | Yata | G09G 3/3233 |
| 2020/0152712 A1 | 5/2020 | Chung et al. | |
| 2020/0194512 A1 | 6/2020 | Wang | |

FOREIGN PATENT DOCUMENTS

| | | |
|---|---|---|
| CN | 109300936 | 2/2019 |
| CN | 109671759 | 4/2019 |

\* cited by examiner

LIGHT-EMITTING SUBSTRATE AND DISPLAY DEVICE

RELATED APPLICATIONS

This application is a National Phase of PCT Patent Application No. PCT/CN2019/105294 having International filing date of Sep. 11, 2019, which claims the benefit of priority of Chinese Patent Application No. 201910636037.6 filed on Jul. 15, 2019. The contents of the above applications are all incorporated by reference as if fully set forth herein in their entirety.

FIELD AND BACKGROUND OF THE INVENTION

The present application relates to the field of display technologies, and in particular, to a light-emitting substrate and a display device.

In recent years, organic light-emitting diodes (OLEDs) have greatly attracted attention of scientific research and industry because of their characteristics such as self-luminescence, low energy consumption, wide viewing angles, rich colors, fast response times, and suitability for fabricating flexible screens. They are considered as being potential next-generation display technology.

In related technologies, a fine metal mask (FMM) is generally used for vapor deposition when fabricating OLED pixels, and in order to achieve a high-resolution effect, openings in the FMM need to be made small so that formed pixel size is smaller and can be arranged on a substrate in a small and dense manner, some factors such as the alignment accuracy of the FMM need to be controlled if such a fabrication method is applied, and because pixels are small and are arranged in a considerably dense manner, it is easy to produce color mixing.

Therefore, the current technology has defects and needs to be improved urgently.

SUMMARY OF THE INVENTION

Technical Problem

The embodiments of the present application provide a light-emitting substrate and a display device, which can improve the resolution while avoiding color mixing and reducing processing difficulty.

Technical Solutions

In a first aspect, an embodiment of the present application provides a light-emitting substrate, including: a substrate, and a first pixel group and a second pixel group arranged on the substrate spaced apart from each other, wherein a third pixel group is disposed between the first pixel group and the second pixel group, a first interval is defined between the first pixel group and the third pixel group, and between the second pixel group and the third pixel group, a second interval is defined between adjacent first sub-pixels of the first pixel group, a third interval is defined between adjacent second sub-pixels of the second pixel group, a fourth interval is defined between adjacent third sub-pixels of the third pixel group, and the first sub-pixels, the second sub-pixels, and the third sub-pixels are all different in colors.

In the light-emitting substrate of the present application, a number of the first sub-pixels in the first pixel group is same as a number of the second sub-pixels in the second pixel group, and is twice a number of the third sub-pixels in the third pixel group.

In the light-emitting substrate of the present application, the number of the first sub-pixels in the first pixel group is four, the number of the second sub-pixels in the second pixel group is four, and the number of the third sub-pixels in the third pixel group is two.

In the light-emitting substrate of the present application, the first sub-pixels, the second sub-pixels, and the third sub-pixels have a same square shape; and wherein the first sub-pixels of the first pixel group are arranged in rows and each row is provided with two of the first sub-pixels, the second sub-pixels of the second pixel group are arranged in rows and each row is provided with two of the second sub-pixels, and the third sub-pixels of the third pixel group are arranged in rows and each row is provided with one of the third sub-pixels.

In the light-emitting substrate of the present application, the first sub-pixels in the first pixel group close to the third pixel group, the second sub-pixels in the second pixel group close to the third pixel group, and the third sub-pixels in the third pixel group constitute a pixel unit.

In the light-emitting substrate of the present application, the pixel units of adjacent rows are arranged staggered by a first preset width, and the first preset width is equal to half of a width of the pixel unit in a horizontal direction.

In the light-emitting substrate of the present application, the first sub-pixels, the second sub-pixels, and the third sub-pixels in the pixel units of adjacent rows are arranged in one-to-one correspondence.

In the light-emitting substrate of the present application, horizontal widths of the second interval, the third interval, and the fourth interval are same.

In the light-emitting substrate of the present application, the colors of the first sub-pixels, second sub-pixels, and third sub-pixels can be red, green, or blue.

According to a second aspect, an embodiment of the present application further provides a display device, including a light-emitting substrate and a casing, the light-emitting substrate disposed on the casing, the light-emitting substrate including:

a substrate, and a first pixel group and a second pixel group arranged on the substrate spaced apart from each other, wherein a third pixel group is disposed between the first pixel group and the second pixel group, a first interval is defined between the first pixel group and the third pixel group, and between the second pixel group and the third pixel group, a second interval is defined between adjacent first sub-pixels of the first pixel group, a third interval is defined between adjacent second sub-pixels of the second pixel group, a fourth interval is defined between adjacent third sub-pixels of the third pixel group, and the first sub-pixels, the second sub-pixels, and the third sub-pixels are all different in colors.

In the light-emitting substrate of the present application, a number of the first sub-pixels in the first pixel group is same as a number of the second sub-pixels in the second pixel group, and is twice a number of the third sub-pixels in the third pixel group.

In the light-emitting substrate of the present application, the number of the first sub-pixels in the first pixel group is four, the number of the second sub-pixels in the second pixel group is four, and the number of the third sub-pixels in the third pixel group is two.

In the light-emitting substrate of the present application, the first sub-pixels, the second sub-pixels, and the third sub-pixels have a same square shape; and wherein the first sub-pixels of the first pixel group are arranged in rows and each row is provided with two the first sub-pixels, the second sub-pixels of the second pixel group are arranged in rows and each row is provided with two of the second sub-pixels, and the third sub-pixels of the third pixel group are arranged in rows and each row is provided with one of the third sub-pixel.

In the light-emitting substrate of the present application, the first sub-pixels in the first pixel group close to the third pixel group, the second sub-pixels in the second pixel group close to the third pixel group, and the third sub-pixels in the third pixel group constitute a pixel unit.

In the light-emitting substrate of the present application, the pixel units of adjacent rows are arranged staggered by a first preset width, and the first preset width is equal to half of a width of the pixel unit in a horizontal direction.

In the light-emitting substrate of the present application, the first sub-pixels, the second sub-pixels, and the third sub-pixels in the pixel units of adjacent rows are arranged in one-to-one correspondence.

In the light-emitting substrate of the present application, horizontal widths of the second interval, the third interval, and the fourth interval are same.

In the light-emitting substrate of the present application, the colors of the first sub-pixels, second sub-pixels, and third sub-pixels can be red, green, or blue.

According to a third aspect, an embodiment of the present application further provides a light-emitting substrate, including: a substrate, and a first pixel group and a second pixel group arranged on the substrate spaced apart from each other, wherein a third pixel group is disposed between the first pixel group and the second pixel group, a first interval is defined between the first pixel group and the third pixel group, and between the second pixel group and the third pixel group, a second interval is defined between adjacent first sub-pixels of the first pixel group, a third interval is defined between adjacent second sub-pixels of the second pixel group, a fourth interval is defined between adjacent third sub-pixels of the third pixel group, the first sub-pixels, the second sub-pixels, and the third sub-pixels are all different in colors, wherein a number of the first sub-pixels in the first pixel group is same as a number of the second sub-pixels in the second pixel group, and is twice a number of third sub-pixels in the third pixel group, and horizontal widths of the second interval, the third interval, and the fourth interval are same.

In the light-emitting substrate of the present application, the number of the first sub-pixels in the first pixel group is four, the number of the second sub-pixels in the second pixel group is four, and the number of the third sub-pixels in the third pixel group is two, and the colors of the first sub-pixels, second sub-pixels, and third sub-pixels can be red, green, or blue.

Beneficial Effect

The light-emitting substrate provided in the embodiment of the present application includes a substrate, and a first pixel group and a second pixel group arranged on the substrate and spaced apart from each other, wherein a third pixel group is disposed between the first pixel group and the second pixel group. A first interval is defined between the first pixel group and the third pixel group and between the second pixel group and the third pixel group, a second interval is defined between adjacent first sub-pixels of the first pixel group, a third interval is defined between adjacent second sub-pixels of the second pixel group, a fourth interval is defined between adjacent third sub-pixels of the third pixel group, and the first sub-pixels, the second sub-pixels, and the third sub-pixels are all different in colors. Through the mask, there is an interval defined between adjacent pixel groups and between adjacent sub-pixels on the substrate to prevent color mixing. In addition, each pixel unit has sub-pixels of different colors, which can improve the resolution and reduce the processing difficulty without shrinking the openings in the mask.

BRIEF DESCRIPTION OF THE SEVERAL VIEWS OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DESCRIPTION OF SPECIFIC EMBODIMENTS OF THE INVENTION

Figure 1:
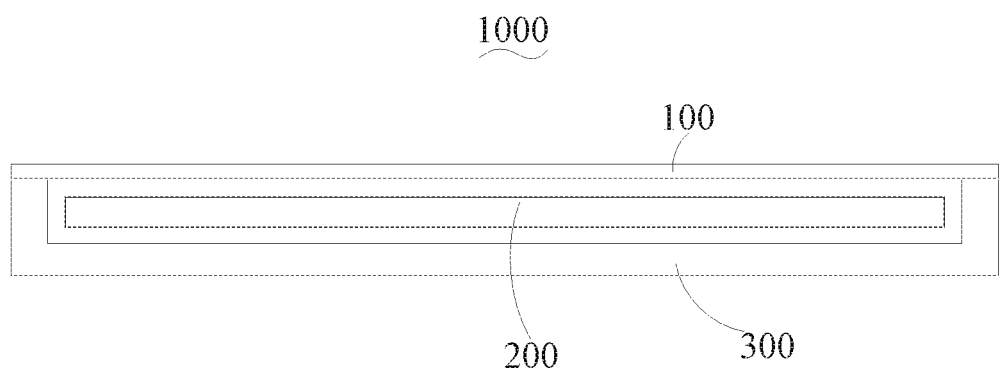
FIG. 1 is a schematic structural diagram of a display device according to an embodiment of the present application.

The following content combines with the drawings and the embodiment for describing the present application in detail. It is obvious that the following embodiments are merely some embodiments of the present application, but not all the embodiments. Based on the embodiments in the present application, for the skilled persons of ordinary skill in the art without creative effort, the other embodiments obtained thereby are still covered by the present application.

In the conventional art, a fine metal mask (FMM) is generally used for vapor deposition when organic light-emitting diode (OLED) pixels are fabricated, and in order to achieve a high-resolution effect, openings in the FMM need to be made small so that a pixel size is small and can be arranged on the substrate in a small and dense manner. However, when applying such a fabrication method, some factors such as alignment accuracy of the FMM, mask shadow, and so on need to be controlled. It is more difficult to process products, and the densely arranged pixels are prone to color mixing problems. Also the distance between adjacent openings in the FMM is small, which often leads to deformation of the FMM, and it is more difficult to use such a FMM during processing.

An embodiment of the present application provides a display device, including a light-emitting substrate and a casing, the light-emitting substrate disposed on the casing, the light-emitting substrate including:

a substrate, and a first pixel group and a second pixel group arranged on the substrate and spaced apart from each other, wherein a third pixel group is disposed between the first pixel group and the second pixel group, a first interval is defined between the first pixel group and the third pixel group, and between the second pixel group and the third pixel group, a second interval is defined between adjacent first sub-pixels of the first pixel group, a third interval is defined between adjacent second sub-pixels of the second pixel group, a fourth interval is defined between adjacent third sub-pixels of the third pixel group, and the first sub-pixels, the second sub-pixels, and the third sub-pixels are all different in colors.

Meanwhile, a number of the first sub-pixels in the first pixel group is same as a number of the second sub-pixels in the second pixel group and is twice a number of the third sub-pixels in the third pixel group.

Meanwhile, the number of the first sub-pixels in the first pixel group is four, the number of the second sub-pixels in the second pixel group is four, and the number of the third sub-pixels in the third pixel group is two.

Furthermore, the first sub-pixels, the second sub-pixels, and the third sub-pixels have a same square shape; and wherein the first sub-pixels of the first pixel group are arranged in rows and each row is provided with two of the first sub-pixels, the second sub-pixels of the second pixel group are arranged in rows and each row is provided with two of the second sub-pixels, and the third sub-pixels of the third pixel group are arranged in rows and each row is provided with one of the third sub-pixels.

Meanwhile, the first sub-pixels in the first pixel group close to the third pixel group, the second sub-pixels in the second pixel group close to the third pixel group, and the third sub-pixels in the third pixel group constitute a pixel unit.

Meanwhile, the pixel units of adjacent rows are arranged staggered by a first preset width, and the first preset width is equal to half of a width of the pixel unit in a horizontal direction.

Meanwhile, the first sub-pixels, the second sub-pixels, and the third sub-pixels in the pixel units of adjacent rows are arranged in one-to-one correspondence.

Meanwhile, horizontal widths of the second interval, the third interval, and the fourth interval are same.

Meanwhile, the colors of the first sub-pixels, second sub-pixels, and third sub-pixels can be red, green, or blue.

Please refer to FIG. 1, which is a schematic structural diagram of a display device 1000 according to an embodiment of the present application. The display device 1000 can include a light-emitting substrate 100, a control circuit 200, and a casing 300. It should be noted that the display device 1000 shown in FIG. 1 is not limited to the above and can also include other devices, such as a camera, an antenna structure, and a pattern unlocking module.

The light-emitting substrate 100 is disposed on the casing 200.

In some embodiments, the light-emitting substrate 100 can be fixed to the casing 200, and the light-emitting substrate 100 and the casing 300 form a close space to accommodate devices such as the control circuit 200.

In some embodiments, the casing 300 can be made of a flexible material, such as a plastic casing or a silicone casing.

The control circuit 200 is installed in the casing 300. The control circuit 200 can be a main board of the display device 1000. The control circuit 200 can be integrated with functional components such as one, two or more of a battery, an antenna structure, a microphone, a speaker, a headphone interface, a universal serial bus interface, a camera, a distance sensor, an ambient light sensor, a receiver, and a processor.

The light-emitting substrate 100 is installed in the casing 300, and at the same time, the light-emitting substrate 100 is electrically connected to the control circuit 200 to form a display surface of the display device 1000. The light-emitting substrate 100 can include a display region and a non-display region. The display region can be used to display an image of the display device 1000 or for a user to perform touch control. The non-display region can be used to set various functional components.

Figure 2:
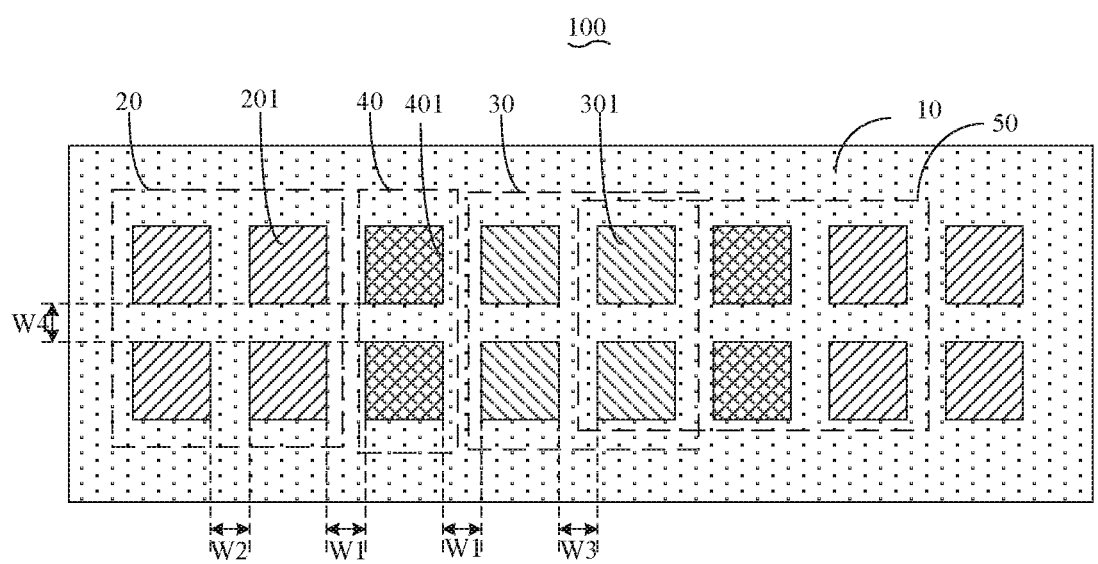
FIG. 2 is a schematic diagram of a first structure of a light-emitting substrate according to an embodiment of the present application.
Figure 3:
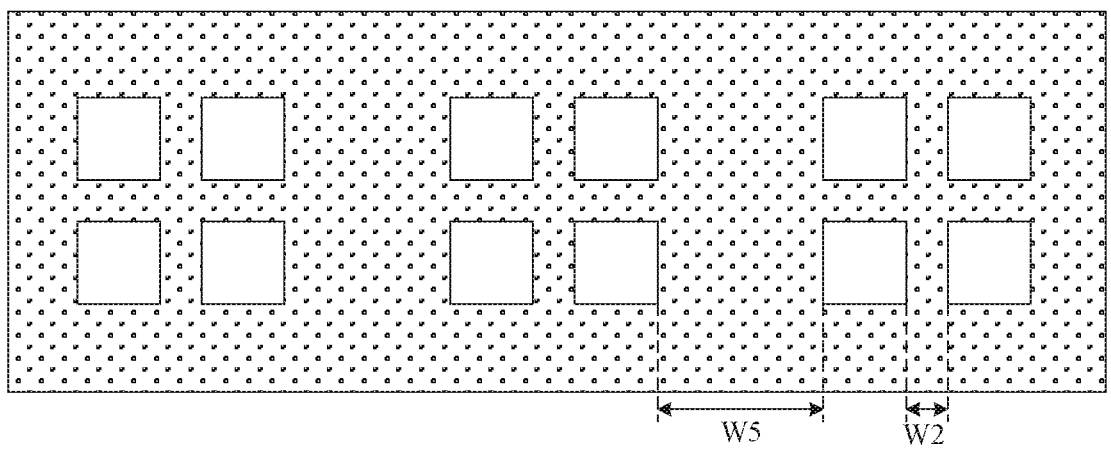
FIG. 3 is a mask for fabricating a first pixel group and a second pixel group according to an embodiment of the present application.
Figure 4:
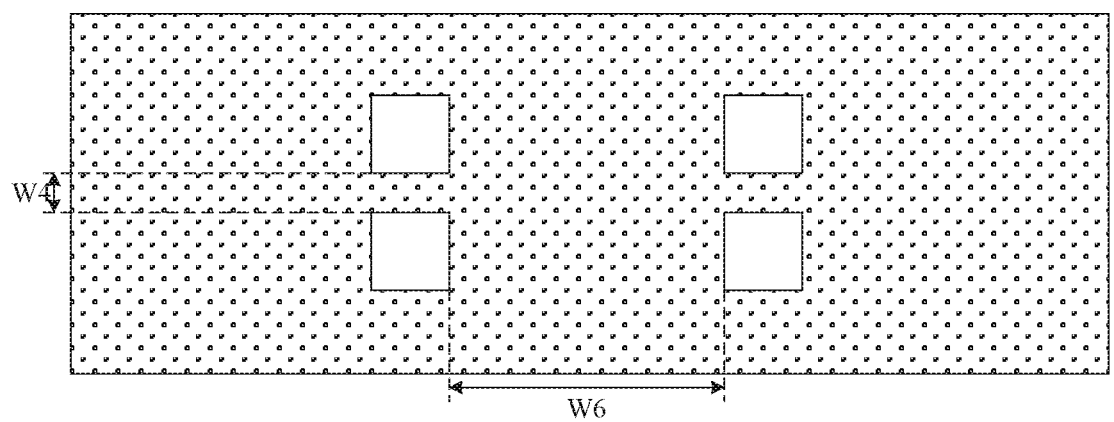
FIG. 4 is a mask for fabricating a third pixel group according to an embodiment of the present application.

Please refer to FIG. 2, which is a schematic diagram of a first structure of the light-emitting substrate 100 according to an embodiment of the present application. FIG. 3 is a schematic diagram of a second structure of the light-emitting substrate 100 according to an embodiment of the present application, and FIG. 4 is a schematic diagram of a third structure of the light-emitting substrate 100 according to an embodiment of the present application. The light-emitting substrate 100 includes:

a substrate 10, and a first pixel group 20 and a second pixel group 30 arranged on the substrate 10 and spaced apart from each other, wherein a third pixel group 40 is disposed between the first pixel group 20 and the second pixel group 30, a first interval 101 is defined between the first pixel group 20 and the third pixel group 30, and between the second pixel group 30 and the third pixel group 40, a second interval 102 is defined between adjacent first sub-pixels 201 of the first pixel group 20, a third interval 103 is defined between adjacent second sub-pixels 301 of the second pixel group 30, a fourth interval 104 is defined between adjacent third sub-pixels 401 of the third pixel group 40, and the first sub-pixels 201, the second sub-pixels 301, and the third sub-pixels 401 are all different in colors.

Specifically, as can be seen from FIG. 2, the first pixel group 20 and the second pixel group 30 are arranged on the substrate 10 at intervals. The first pixel group 20 includes a plurality of first sub-pixels 201. The second pixel group 30 includes a plurality of second sub-pixels 301. The third pixel group 40 is disposed between the first pixel group 20 and the second pixel group 30. The first interval W1 is defined between two adjacent pixel groups, the second interval W2 is defined between the adjacent first sub-pixels 201 of the first pixel group 20, the third interval W3 is defined between the adjacent second sub-pixels 301 of the second pixel group 30, and the fourth interval W4 is defined between the adjacent third sub-pixels 401 of the third pixel group 40. It can be understood that these intervals are set to prevent the first sub-pixels 201, the second sub-pixels 301, and the third sub-pixels 401 from color mixing during light emission caused by an extremely dense arrangement.

Here, the colors of the first sub-pixels 201, the second sub-pixels 301, and the third sub-pixels 401 are selected from three colors of red, green, and blue (R, G, B), the first sub-pixels 201, the second sub-pixels 301, and the third sub-pixels 401 are all different in colors, and the colors of the sub-pixels in a same pixel group are same.

In some embodiments, as shown in FIGS. 3 and 4, where FIG. 3 is a mask 200 for fabricating the first pixel group 20 and the second pixel group 30 according to an embodiment of the present application, and FIG. 4 is a mask 300 for fabricating the third pixel group 40 according to an embodiment of the present application.

It can be understood that when the light-emitting substrate 100 shown in FIG. 2 is fabricated, the plurality of pixel groups are formed by adopting a FMM on the substrate 10. Therefore, the mask 200 is provided corresponding to the first pixel group 20 and the second pixel group 30, wherein a plurality of openings defined in the mask 200 corresponding to positions of the first sub-pixels 201 of the first pixel group 20 or positions of the second sub-pixels 301 of the second pixel group 30. Moreover, the interval between adjacent openings is also same as the interval between adjacent sub-pixels of a same pixel group in the first pixel group 20 and the second pixel group 30. Preferably, if horizontal widths of the second interval W2 and the third interval W3 are same, the first pixel group 20 and the second pixel group 30 can be fabricated by the same mask in the processing, reducing the use of a layer of a mask and also omitting work of cleaning a mask after the fabrication is completed.

Here, the horizontal widths of the second interval W2, the third interval W3, and the fourth interval W4 are same. The horizontal width of the first interval W1 can be same as each of the horizontal widths of the second interval W2, the third interval W3, and the fourth interval W4, which are not limited thereto.

Similarly, when the third pixel group 40 shown in FIG. 2 is fabricated, the mask 300 used for fabricating the corresponding third pixel group 40 is provided, and the interval between the adjacent openings in the mask 300 is also same as the fourth interval W4. Moreover, interval W5 of the mask 200 and interval W6 of the mask 300 according to the present application are relatively wider and do not easily deform in the processing.

In some embodiments, a number of the first sub-pixels 201 in the first pixel group 20 is same as a number of the second sub-pixels 301 in the second pixel group 30, and is twice a number of the third sub-pixels 401 in the third pixel group 40.

Preferably, the number of the first sub-pixels 201 in the first pixel group 20 is four, the number of the second sub-pixels 301 in the second pixel group 30 is four, and the number of the third sub-pixels 401 in the third pixel group 40 is two so that the light can be controlled to be more uniform.

In some embodiments, as shown in FIG. 2, the first sub-pixels 201, the second sub-pixels 301, and the third sub-pixels 401 have a same square shape. Moreover, the first sub-pixels 201 of the first pixel group 20 are arranged in rows and each row is provided with two of the first sub-pixels 201, the second sub-pixels 301 of the second pixel group 30 are arranged in rows and each row is provided with two of the second sub-pixels 301, and the third sub-pixels 401 of the third pixel group 40 are arranged in rows and each row is provided with one of the third sub-pixels 401. The shape of the sub-pixels herein is merely an implementation manner of an embodiment, and other shapes can also be used. Details are not described herein again.

In some embodiments, the first sub-pixels 201 in the first pixel group 20 close to the third pixel group 40, the second sub-pixels 301 in the second pixel group 30 close to the third pixel group 40, and the third sub-pixels 401 in the third pixel group 40 constitute a pixel unit 50.

The embodiment here is to divide the sub-pixels arranged on the substrate 10 to ensure that each pixel unit 50 has a first sub-pixel 201, a second sub-pixel 301, and a third sub-pixel 401, and the sub-pixels can be controlled independently to improve the resolution when the sub-pixels are lit.

Figure 5:
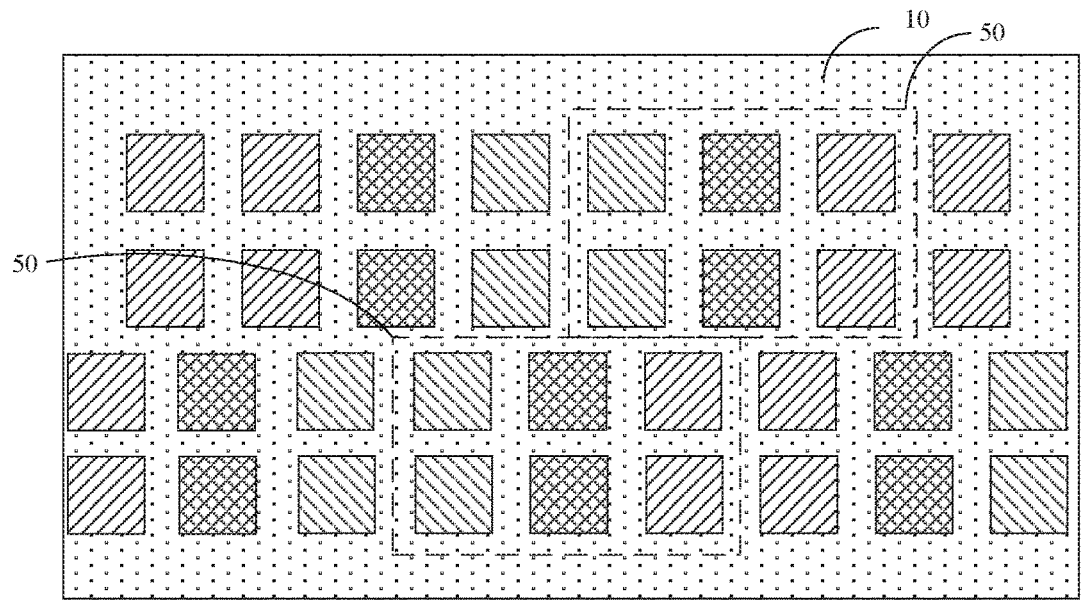
FIG. 5 is a schematic diagram of a second structure of the light-emitting substrate according to an embodiment of the present application.

In some embodiments, as shown in FIG. 5, FIG. 5 is a schematic diagram of a second structure of the light-emitting substrate 100 according to an embodiment of the present application. The pixel units 50 in the adjacent rows are arranged staggered by a first preset width. The first preset width is equal to half of a width of the pixel unit in a horizontal direction.

Figure 6:
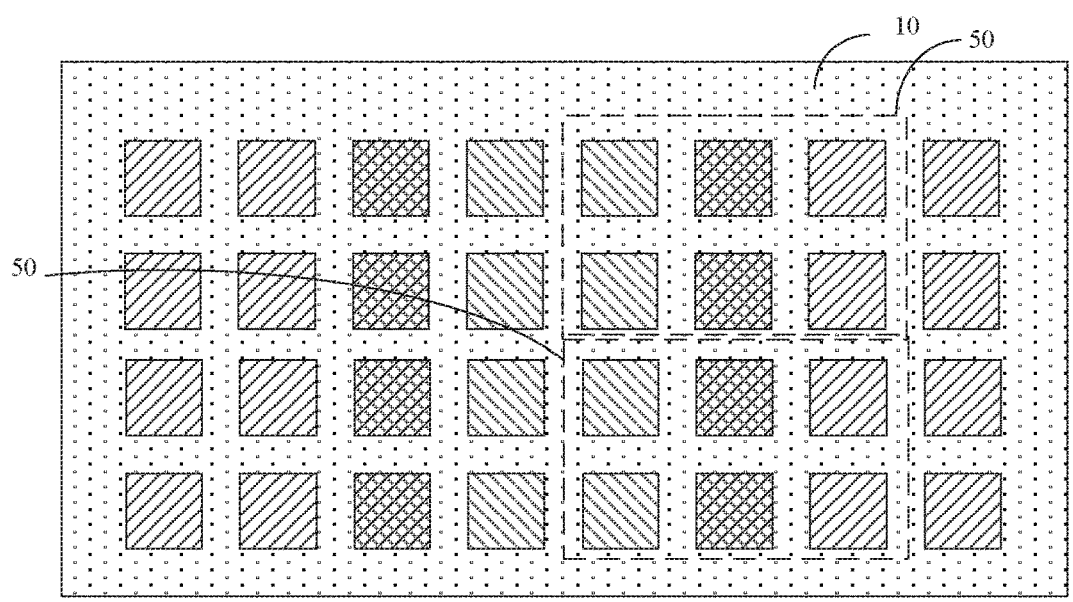
FIG. 6 is a schematic diagram of a third structure of the light-emitting substrate according to an embodiment of the present application.

In some embodiments, as shown in FIG. 6, FIG. 6 is a schematic diagram of a third structure of the light-emitting substrate 100 according to an embodiment of the present application. The first sub-pixels 201, the second sub-pixels 301, and the third sub-pixels 401 in the pixel units 50 of adjacent rows are arranged in one-to-one correspondence.

The light-emitting substrate 100 according to the embodiment of the present application includes a substrate, and a first pixel group and a second pixel group arranged on the substrate and spaced apart from each other, wherein a third pixel group is disposed between the first pixel group and the second pixel group, a first interval is defined between the first pixel group and the third pixel group, and between the second pixel group and the third pixel group, a second interval is defined between adjacent first sub-pixels of the first pixel group, a third interval is defined between adjacent second sub-pixels of the second pixel group, a fourth interval is defined between adjacent third sub-pixels of the third pixel group, and the first sub-pixels, the second sub-pixels, and the third sub-pixels are all different in colors. By setting the intervals between adjacent pixel groups and adjacent sub-pixels, color mixing can be avoided, and the colors of the sub-pixels in each pixel group are different to improve resolution. In addition, there is an interval between each sub-pixel arranged on the substrate through the mask. There is no need to shrink the openings of the mask, and a distance between adjacent openings in the mask is increased to reduce processing difficulty.

Moreover, through the mask, there is an interval defined between adjacent sub-pixels on the substrate, which can improve the resolution and reduce the processing difficulty without shrinking the openings in the mask.

An embodiment of the present application further provides a light-emitting substrate, including: a substrate, and a first pixel group and a second pixel group arranged on the substrate and spaced apart from each other, wherein a third pixel group is disposed between the first pixel group and the second pixel group, a first interval is defined between the first pixel group and the third pixel group, and between the second pixel group and the third pixel group, a second interval is defined between adjacent first sub-pixels of the first pixel group, a third interval is defined between adjacent second sub-pixels of the second pixel group, a fourth interval is defined between adjacent third sub-pixels of the third pixel group, the first sub-pixels, the second sub-pixels, and the third sub-pixels are all different in colors, wherein a number of the first sub-pixels in the first pixel group is same as a number of the second sub-pixels in the second pixel group and is twice a number of third sub-pixels in the third pixel group, and horizontal widths of the second interval, the third interval, and the fourth interval are same.

The number of the first sub-pixels in the first pixel group is four, the number of the second sub-pixels in the second pixel group is four, and the number of the third sub-pixels in the third pixel group is two, the colors of the first sub-pixels, second sub-pixels, and third sub-pixels can be red, green, or blue.

The light-emitting substrate and display device provided in the embodiments of the present application have been described in detail above. Specific examples are used in the present document to explain the principles and implementation of the present application. The descriptions of the above embodiments are merely used to help understand technical solutions and their core ideas of the present application. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A light-emitting substrate, comprising: a substrate, and a first pixel group and a second pixel group arranged on the substrate and spaced apart from each other, wherein a third pixel group is disposed between the first pixel group and the second pixel group, a first interval is defined between the first pixel group and the third pixel group, and between the second pixel group and the third pixel group, a second interval is defined between adjacent first sub-pixels of the first pixel group, a third interval is defined between adjacent second sub-pixels of the second pixel group, a fourth interval is defined between adjacent third sub-pixels of the third pixel group, and the first sub-pixels, the second sub-pixels, and the third sub-pixels are all different in colors, wherein a number of the first sub-pixels in the first pixel group is same as a number of the second sub-pixels in the second pixel group and is twice a number of the third sub-pixels in the third pixel group; the number of the first sub-pixels in the first pixel group is four, the number of the second sub-pixels in the second pixel group is four, and the number of the third sub-pixels in the third pixel group is two; the first sub-pixels, the second sub-pixels, and the third sub-pixels have a same square shape; and the first sub-pixels of the first pixel group are arranged in rows and each row is provided with two of the first sub-pixels, the second sub-pixels of the second pixel group are arranged in rows and each row is provided with two of the second sub-pixels, and the third sub-pixels of the third pixel group are arranged in rows and each row is provided with one of the third sub-pixels.

2. The light-emitting substrate according to claim 1, wherein the first sub-pixels in the first pixel group close to the third pixel group, the second sub-pixels in the second pixel group close to the third pixel group, and the third sub-pixels in the third pixel group constitute a pixel unit.

3. The light-emitting substrate according to claim 2, wherein the pixel units in adjacent rows are arranged staggered by a first preset width, and the first preset width is equal to half of a width of the pixel unit in a horizontal direction.

4. The light-emitting substrate according to claim 2, wherein the first sub-pixels, the second sub-pixels, and the third sub-pixels in the pixel units of adjacent rows are arranged in one-to-one correspondence.

5. The light-emitting substrate according to claim 1, wherein horizontal widths of the second interval, the third interval, and the fourth interval are same.

6. The light-emitting substrate according to claim 1, wherein the colors of the first sub-pixels, the second sub-pixels, and the third sub-pixels can be red, green, or blue.

7. A display device, comprising a light-emitting substrate and a casing, the light-emitting substrate disposed on the casing, the light-emitting substrate comprising:

a substrate, and a first pixel group and a second pixel group arranged on the substrate and spaced apart from each other, wherein a third pixel group is disposed between the first pixel group and the second pixel group, a first interval is defined between the first pixel group and the third pixel group, and between the second pixel group and the third pixel group, a second interval is defined between adjacent first sub-pixels of the first pixel group, a third interval is defined between adjacent second sub-pixels of the second pixel group, a fourth interval is defined between adjacent third sub-pixels of the third pixel group, and the first sub-pixels, the second sub-pixels, and the third sub-pixels are all different in colors, wherein a number of the first sub-pixels in the first pixel group is same as a number of the second sub-pixels in the second pixel group and is twice a number of the third sub-pixels in the third pixel group; the number of the first sub-pixels in the first pixel group is four, the number of the second sub-pixels in the second pixel group is four, and the number of the third sub-pixels in the third pixel group is two; the first sub-pixels, the second sub-pixels, and the third sub-pixels have a same square shape; and the first sub-pixels of the first pixel group are arranged in rows and each row is provided with two of the first sub-pixels, the second sub-pixels of the second pixel group are arranged in rows and each row is provided with two of the second sub-pixels, and the third sub-pixels of the third pixel group are arranged in rows and each row is provided with one of the third sub-pixels.

8. The display device according to claim 7, wherein the first sub-pixels in the first pixel group close to the third pixel group, the second sub-pixels in the second pixel group close to the third pixel group, and the third sub-pixels in the third pixel group constitute a pixel unit.

9. The display device according to claim 8, wherein the pixel units in adjacent rows are arranged staggered by a first preset width, and the first preset width is equal to half of a width of the pixel unit in a horizontal direction.

10. The display device according to claim 8, wherein the first sub-pixels, the second sub-pixels, and the third sub-pixels in the pixel units of adjacent rows are arranged in one-to-one correspondence.

11. The display device according to claim 7, wherein horizontal widths of the second interval, the third interval, and the fourth interval are same.

12. The display device according to claim 7, wherein the colors of the first sub-pixels, the second sub-pixels, and the third sub-pixels can be red, green, or blue.

13. A light-emitting substrate, comprising: a substrate, and a first pixel group and a second pixel group arranged on the substrate and spaced apart from each other, wherein a third pixel group is disposed between the first pixel group and the second pixel group, a first interval is defined between the first pixel group and the third pixel group, and between the second pixel group and the third pixel group, a second interval is defined between adjacent first sub-pixels of the first pixel group, a third interval is defined between adjacent second sub-pixels of the second pixel group, a fourth interval is defined between adjacent third sub-pixels of the third pixel group, the first sub-pixels, the second sub-pixels, and the third sub-pixels are all different in colors, wherein a number of the first sub-pixels in the first pixel group is same as a number of the second sub-pixels in the second pixel group and is twice a number of third sub-pixels in the third pixel group, and horizontal widths of the second interval, the third interval, and the fourth interval are same.

14. The light-emitting substrate according to claim 13, wherein the number of the first sub-pixels in the first pixel group is four, the number of the second sub-pixels in the second pixel group is four, the number of the third sub-pixels in the third pixel group is two, and the colors of the first sub-pixels, the second sub-pixels, and the third sub-pixels can be red, green, or blue.

\* \* \* \* \*